(12) United States Patent
Hwang et al.

(10) Patent No.: US 10,513,433 B2
(45) Date of Patent: Dec. 24, 2019

(54) LAMINATED CERAMIC CHIP COMPONENT INCLUDING NANO THIN FILM LAYER, MANUFACTURING METHOD THEREFOR, AND ATOMIC LAYER VAPOR DEPOSITION APPARATUS THEREFOR

(71) Applicants: HONGIK UNIVERSITY INDUSTRY-ACADEMIC COOPERATION FOUNDATION, Seoul (KR); MAX TECH CO., LTD., Gyeonggi-do (KR)

(72) Inventors: Jin Ha Hwang, Seoul (KR); Dae Bum Park, Gyeonggi-do (KR); Yong Jo Choo, Gyeonggi-do (KR); Hyun Suk Kim, Gyeonggi-do (KR); Da Hee Park, Seoul (KR); Myeong Hee Ko, Seoul (KR); Kyoung Woo Kwon, Seoul (KR); Hee Su Hwang, Seoul (KR); Jeong Wan Choi, Seoul (KR)

(73) Assignees: HONGIK UNIVERSITY INDUSTRY-ACADEMIC CORPORATION FOUNDATION, Seoul (KR); MAX TECH CO., LTD., Gyeonggi-do (KR)

( * ) Notice: Subject to any disclaimer, the term of this patent is extended or adjusted under 35 U.S.C. 154(b) by 0 days.

(21) Appl. No.: 15/529,470

(22) PCT Filed: Nov. 28, 2014

(86) PCT No.: PCT/KR2014/011522
§ 371 (c)(1),
(2) Date: May 24, 2017

(87) PCT Pub. No.: WO2016/085004
PCT Pub. Date: Jun. 2, 2016

(65) Prior Publication Data
US 2017/0260046 A1    Sep. 14, 2017

(51) Int. Cl.
*H01G 4/30* (2006.01)
*H01G 4/00* (2006.01)
(Continued)

(52) U.S. Cl.
CPC ............ *B82B 3/0009* (2013.01); *B32B 18/00* (2013.01); *B82B 3/008* (2013.01); *C23C 16/403* (2013.01);
(Continued)

(58) Field of Classification Search
CPC .................................. H01G 4/30; H01G 4/00
See application file for complete search history.

(56) References Cited

U.S. PATENT DOCUMENTS

| 6,683,782 B2 * | 1/2004 | Duva | H01G 2/12 |
| | | | 361/309 |
| 2002/0001969 A1 * | 1/2002 | Jang | C23C 16/403 |
| | | | 438/758 |

(Continued)

FOREIGN PATENT DOCUMENTS

| JP | 06-069003 | 3/1994 |
| JP | 2001044069 A * | 2/2001 |

(Continued)

OTHER PUBLICATIONS

International Search Report dated Aug. 26, 2015 for PCT/KR2014/011522.

*Primary Examiner* — Eric W Thomas

(57) ABSTRACT

The present disclosure discloses the laminated ceramic chimp component including an element part having a ceramic main body and an internal electrode placed in the ceramic main body; an external electrode part having a first external electrode and a second external electrode, the first and second external electrodes being provided with side electrodes covering both side surfaces of the ceramic main (Continued)

body, respectively, upper electrodes covering portions of both sides of an upper surface of the ceramic main body, respectively, and lower electrodes covering portions of both sides of a lower surface of the ceramic main body, respectively; and a nano thin film layer formed of electric insulation material and applied to a region including the upper electrodes, the method for manufacturing the same and the atomic layer deposition apparatus for the same.

4 Claims, 8 Drawing Sheets

(51) Int. Cl.
| | | |
|---|---|---|
| *B82B 3/00* | (2006.01) | |
| *H01G 13/00* | (2013.01) | |
| *H01G 4/232* | (2006.01) | |
| *B32B 18/00* | (2006.01) | |
| *C23C 16/455* | (2006.01) | |
| *C23C 16/458* | (2006.01) | |
| *C23C 16/46* | (2006.01) | |
| *H01G 4/005* | (2006.01) | |
| *H01G 4/33* | (2006.01) | |
| *H05K 3/34* | (2006.01) | |
| *C23C 16/40* | (2006.01) | |
| *B32B 37/00* | (2006.01) | |
| *B32B 37/24* | (2006.01) | |
| *H01G 4/12* | (2006.01) | |

(52) U.S. Cl.
CPC ...... *C23C 16/458* (2013.01); *C23C 16/45544* (2013.01); *C23C 16/45555* (2013.01); *C23C 16/45561* (2013.01); *C23C 16/46* (2013.01); *H01G 4/005* (2013.01); *H01G 4/232* (2013.01); *H01G 4/2325* (2013.01); *H01G 4/30* (2013.01); *H01G 4/33* (2013.01); *H01G 13/00* (2013.01); *H01G 13/006* (2013.01); *H05K 3/3442* (2013.01); *B32B 37/00* (2013.01); *B32B 2037/246* (2013.01); *B32B 2307/20* (2013.01); *C04B 2237/34* (2013.01); *C04B 2237/341* (2013.01); *C04B 2237/343* (2013.01); *C04B 2237/345* (2013.01); *C04B 2237/348* (2013.01); *C04B 2237/366* (2013.01); *C04B 2237/368* (2013.01); *C04B 2237/704* (2013.01); *H01G 4/12* (2013.01); *H05K 2201/10636* (2013.01); *Y02P 70/611* (2015.11); *Y02P 70/613* (2015.11)

(56) References Cited

U.S. PATENT DOCUMENTS

| | | | |
|---|---|---|---|
| 2003/0099085 A1 | 5/2003 | Duva | |
| 2005/0227017 A1* | 10/2005 | Senzaki | C07F 7/025 |
| | | | 427/459 |
| 2015/0318285 A1* | 11/2015 | Zhang | H01L 27/10844 |
| | | | 257/295 |

FOREIGN PATENT DOCUMENTS

| | | | |
|---|---|---|---|
| JP | 2007-242995 | | 9/2007 |
| JP | 2012174916 A | * | 9/2012 |
| KR | 10-2012-0031235 | | 3/2012 |
| KR | 10-2014-0006420 | | 1/2014 |

* cited by examiner

[Fig. 1]
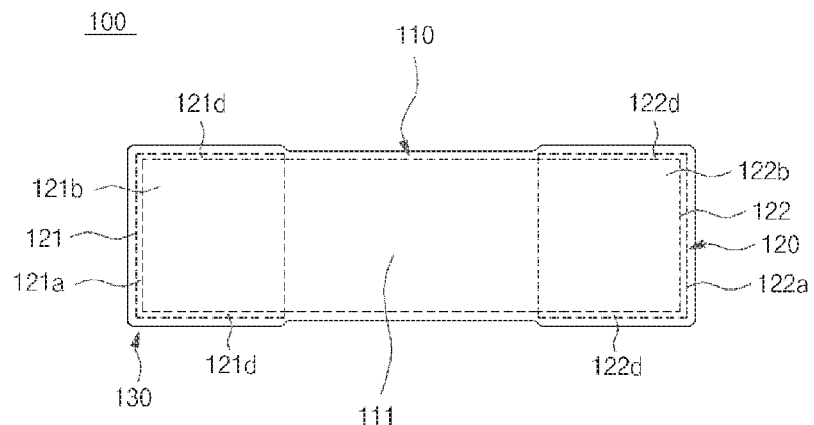
[Fig. 2]
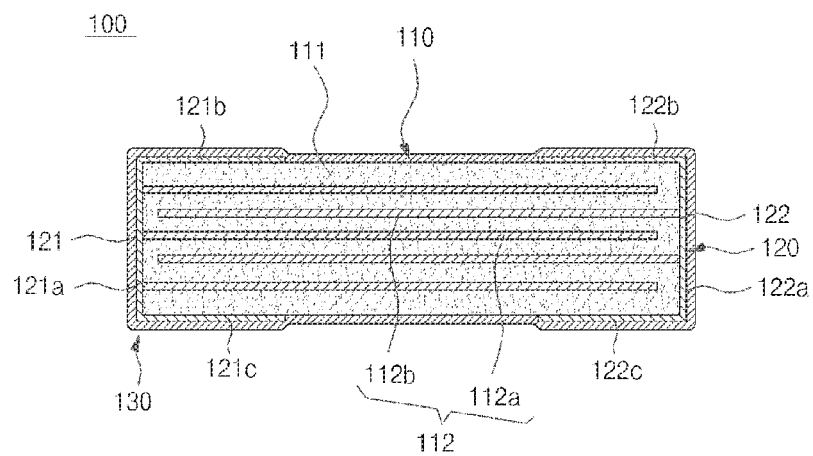
[Fig. 3]
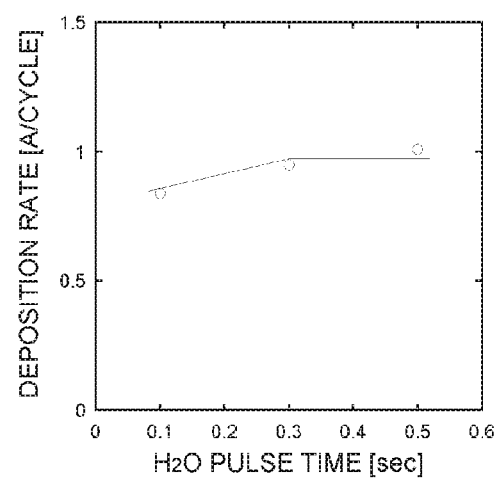

[Fig. 4]
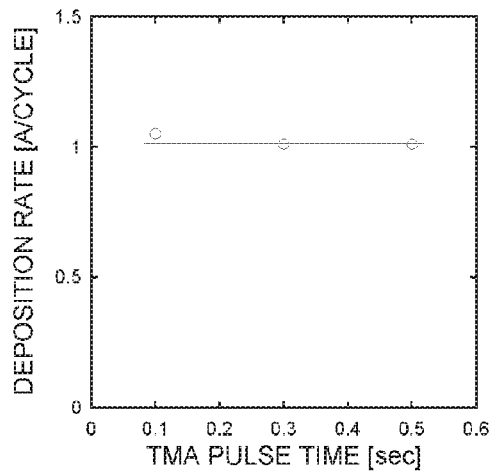
[Fig. 5]
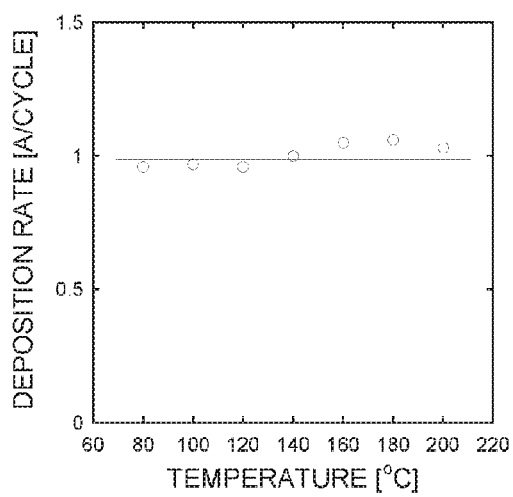
[Fig. 6]
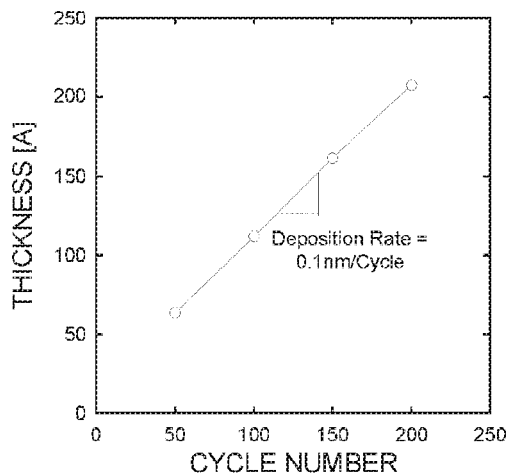

[Fig. 7]
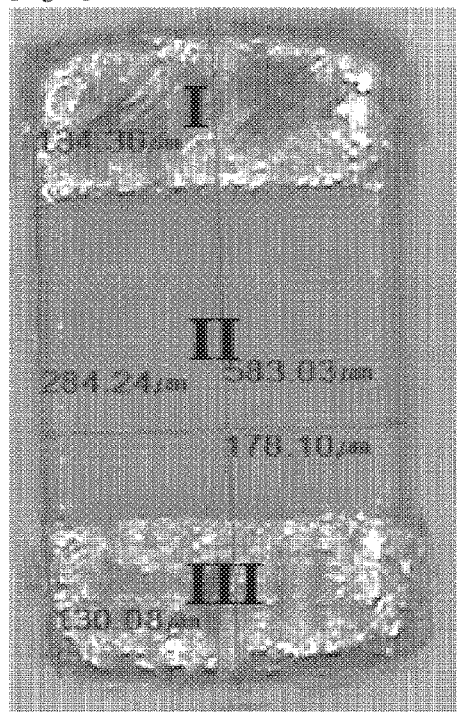
[Fig. 8]
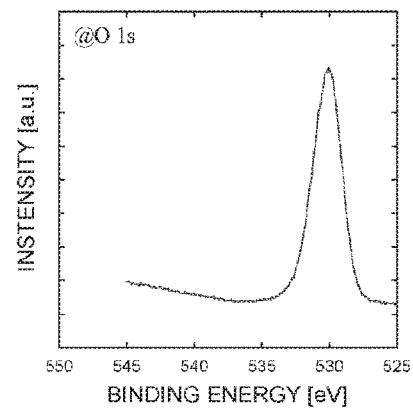
[Fig. 9]
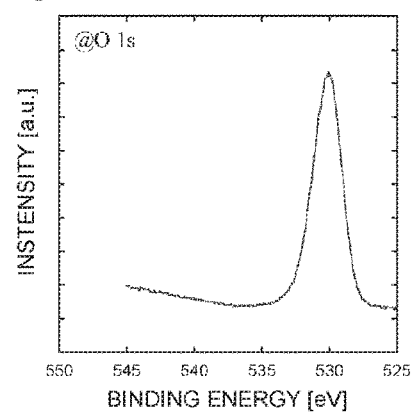

[Fig. 10]
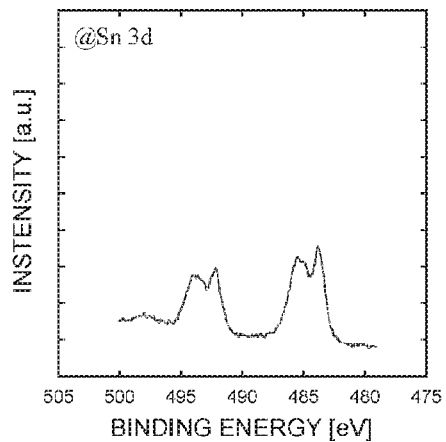
[Fig. 11]
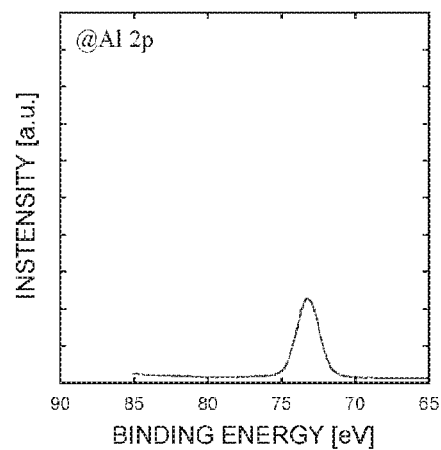
[Fig. 12]
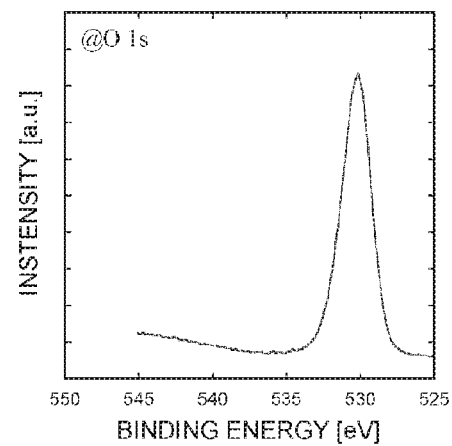

[Fig. 13]
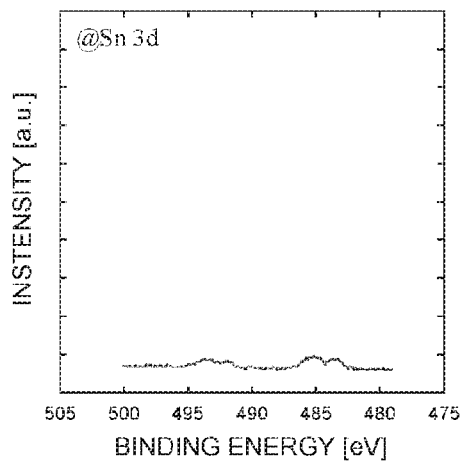
[Fig. 14]
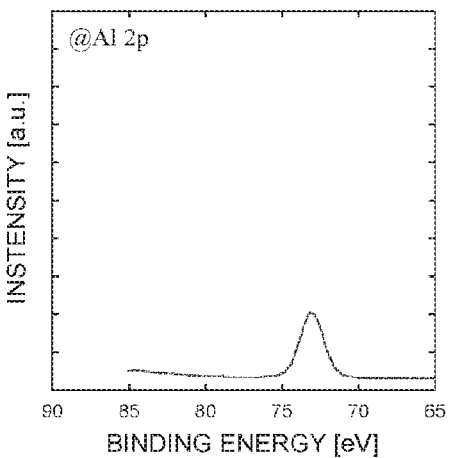
[Fig. 15]
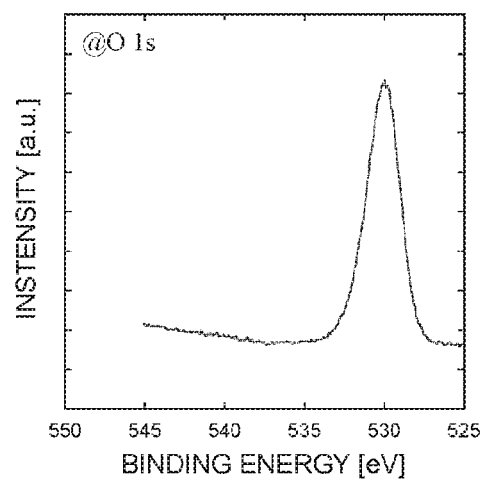

[Fig. 16]
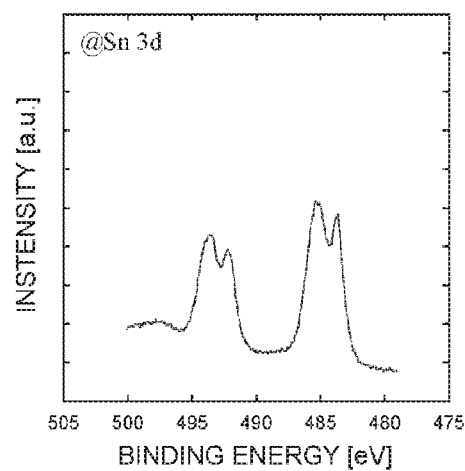
[Fig. 17]
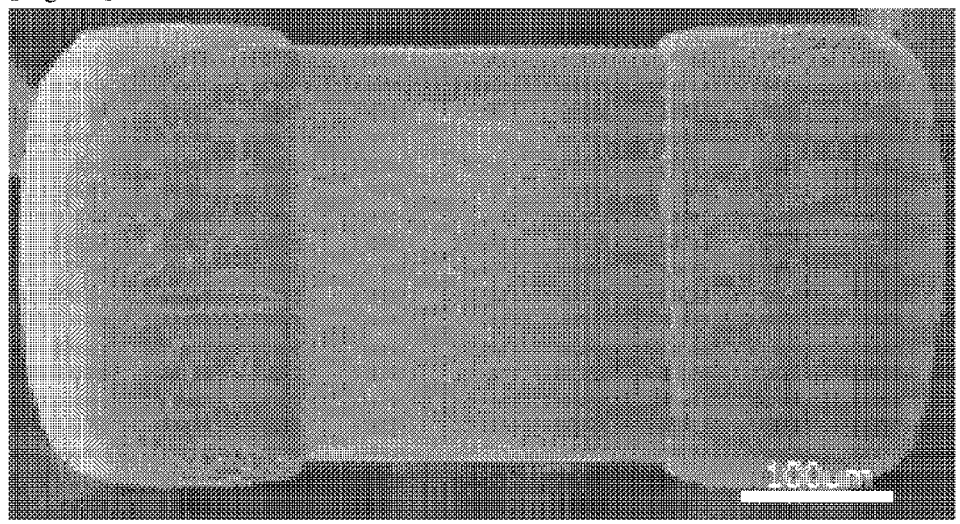
[Fig. 18]
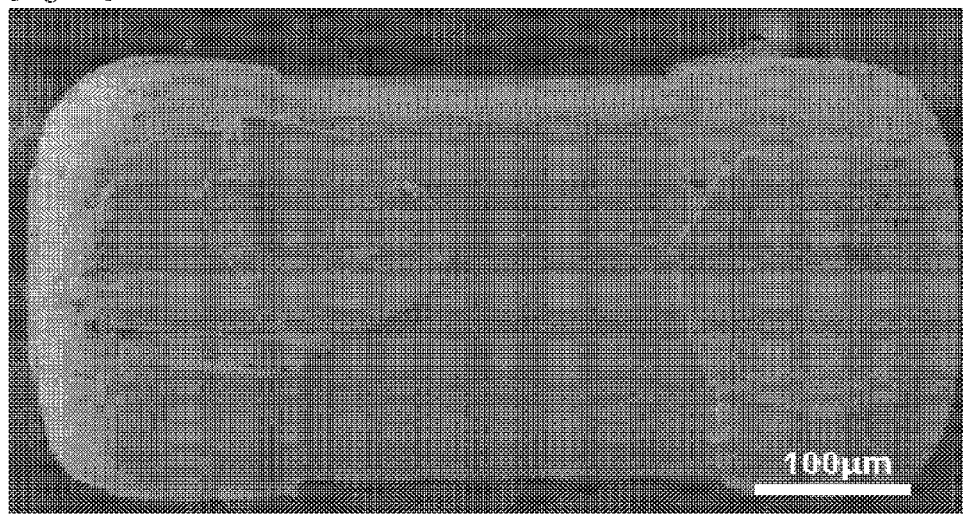

[Fig. 19]
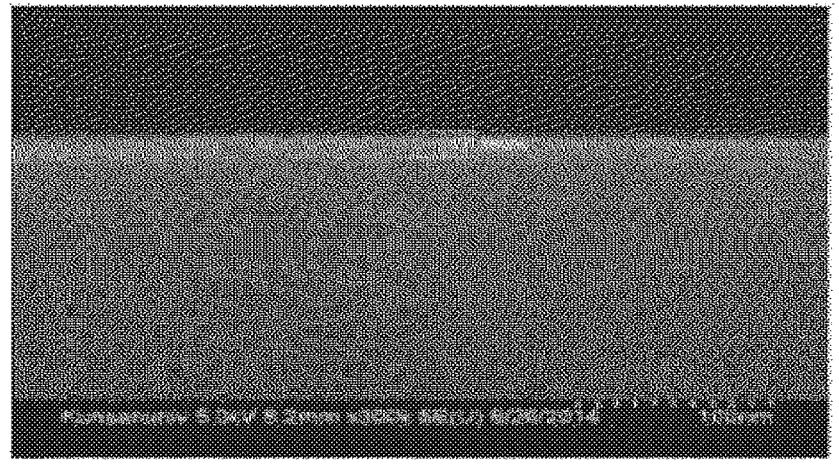
[Fig. 20]
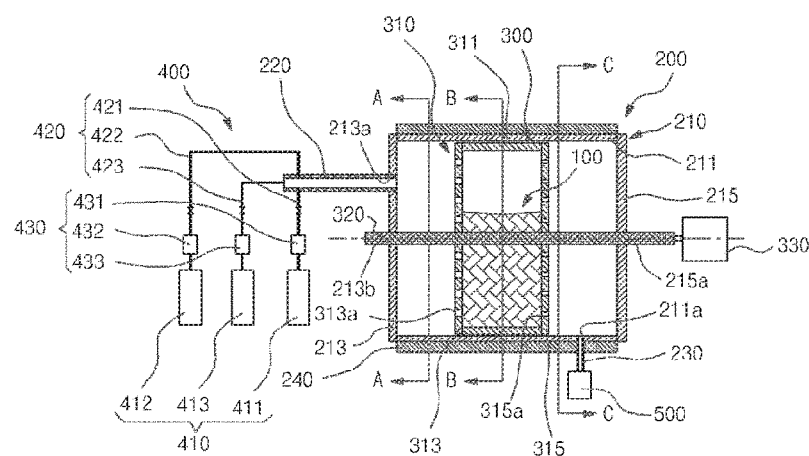
[Fig. 21]
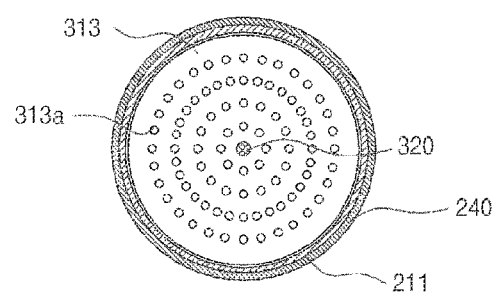
[Fig. 22]
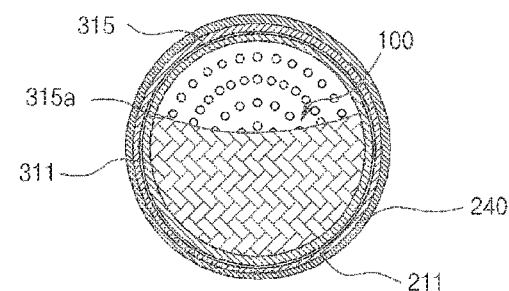

[Fig. 23]
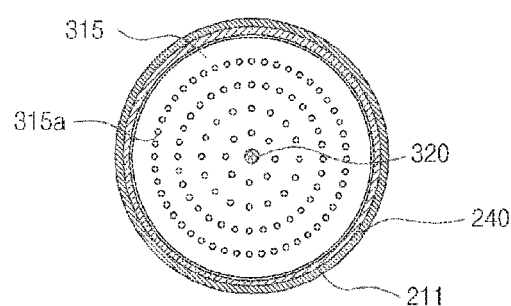
[Fig. 24]
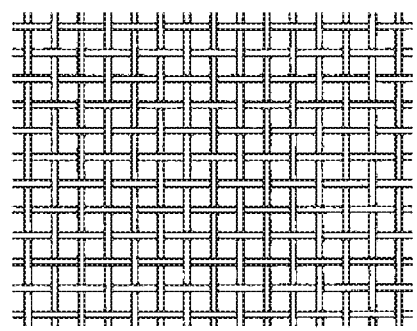

LAMINATED CERAMIC CHIP COMPONENT INCLUDING NANO THIN FILM LAYER, MANUFACTURING METHOD THEREFOR, AND ATOMIC LAYER VAPOR DEPOSITION APPARATUS THEREFOR

This application is the National Stage application of International Application No. PCT/KR2014/011522, filed Nov. 28, 2014, which designates the United States and was published in Korean. The International Application No. PCT/KR2014/011522 is hereby incorporated by reference in its entirety into the present application.

TECHNICAL FIELD

The present disclosure relates to a laminated ceramic chip component including a nano thin film layer, a manufacturing method therefor and an atomic layer deposition apparatus therefor.

BACKGROUND ART

A laminated ceramic chip component is a chip component in which a plurality of ceramic layers are stacked and electrodes are arranged, components such as a laminated ceramic capacitor, a laminated chip inductor, a laminated power inductor or a laminated chip bead may be referred to as the laminated ceramic chip component.

The laminated ceramic capacitor is formed in an approximately rectangular parallelepiped shape and includes an element part and electrode parts formed at both sides of the element part with respect to a widthwise direction. The element part is located at a center portion with respect to the widthwise direction when viewed from an upper surface of the laminated ceramic capacitor, and the electrode parts are located at both sides of the element part. A surface of the element part is formed of ceramic material and the electrode parts are formed of metal such as stannum (Sn).

The laminated ceramic capacitor is adsorbed onto a mounting nozzle of a chip mounter and is then surface-mounted on a circuit board. More specifically, the mounting nozzle adsorbs the laminated ceramic capacitor using a vacuum pressure formed therein while being in contact with the element part and a portion of the electrode part on an upper surface of the laminated ceramic capacitor. At this time, the electrode part of the laminated ceramic capacitor is adsorbed while a region of the electrode part, which is in contact with the mounting nozzle, is pressed by the mounting nozzle due to the vacuum pressure at the time of adsorption. Therefore, even if the vacuum pressure is removed to mount the laminated ceramic capacitor on the circuit board after the laminated ceramic capacitor is transferred to the circuit board by the mounting nozzle, the laminated ceramic capacitor is not easily separated from the mounting nozzle. This is because since the electrode part is formed of a relatively soft metal, it is deformed in the process of being adsorbed onto the mounting nozzle and a bonding force is generated between the electrode part and the mounting nozzle.

Recently, as a size of the laminated ceramic capacitor is continuously reduced, a relative area of the electrode part which is in contact with the mounting nozzle is further increased. Also, as the size of the laminated ceramic capacitor becomes smaller, the area of the portion which is in contact with the mounting nozzle becomes smaller, so that the pressing force applied to the laminated ceramic capacitor by the mounting nozzle tends to increase. Therefore, the case where the laminated ceramic capacitor is not separated from the mounting nozzle in the mounting process is further increased.

Meanwhile, an apparatus such as an atomic layer deposition apparatus, a chemical vapor deposition apparatus and a physical vapor deposition apparatus is employed as a deposition apparatus for forming a nano thin film layer on a surface of an element such as a semiconductor substrate. However, all the above-mentioned deposition apparatuses are the devices which are capable of fixing an object and are employed for forming the nano thin film layer on a surface of the semiconductor substrate having a certain size. For example, the conventional atomic layer deposition apparatus fixes the semiconductor substrate and supplies a source gas to a surface of the semiconductor substrate to form the nano thin film layer. Therefore, the conventional atomic layer deposition apparatus is not suitable for forming the nano thin film layer on a surface of component such as the laminated ceramic chip component which has a small size making it difficult to fix itself.

DISCLOSURE OF THE INVENTION

Technical Problem

The present disclosure provides a laminated ceramic chip component provided with a nano thin film layer which can be easily separated from a mounting nozzle when a vacuum pressure is removed after the small-sized laminated ceramic chip component such as a laminated ceramic capacitor is adsorbed onto the mounting nozzle, and a method for manufacturing the same and an atomic layer deposition apparatus for the same.

Technical Solution

The laminated ceramic chip component provided with a nano thin film layer of the present disclosure includes an element part including a ceramic main body and an internal electrode placed in the ceramic main body; an external electrode part including a first external electrode and a second external electrode, the first and second external electrodes being provided with side electrodes covering both side surfaces of the ceramic main body, respectively, upper electrodes covering portions of both sides of an upper surface of the ceramic main body, respectively, and lower electrodes covering portions of both sides of a lower surface of the ceramic main body, respectively; and a nano thin film layer formed of electric insulation material and applied to a region including the upper electrodes.

In addition, the nano thin film layer may be formed on an outer surface of the external electrode part or an outer surface of the ceramic main body exposed between the first external electrode and the second external electrode. Also, the nano thin film may be formed to have a thickness of 0.5 to 400 nm, preferably of 1 to 100 nm.

Furthermore, the nano thin film layer may be formed of any one selected from the group consisting of $Al_2O_3$, $HfO_2$, $ZrO_2$, $La_2O_3$, $SiO_2$, $Ta_2O_5$, $Nb_2O_5$, $Y_2O_3$, $SrTiO_3$ and $BaTiO_3$, or a compound thereof. Also, the nano thin film layer may be formed of any one selected from the group consisting of AlN and $SiN_x$ or a compound thereof.

In addition, the laminated ceramic chip component may be a laminated ceramic capacitor, a laminated chip inductor, a laminated power inductor or a multi-layer chip bead.

The method for manufacturing a laminated ceramic chip component provided with a nano thin film layer is characterized in that the laminated ceramic chip component includes an element part including a ceramic main body and an internal electrode placed inside the ceramic main body; an external electrode part including a first external electrode and a second external electrode, the first and second external electrodes provided with side electrodes covering both side surfaces of the ceramic main body, respectively, upper electrodes covering portions of both sides of an upper surface of the ceramic main body, respectively, and lower electrodes covering portions of both sides of a lower surface of the ceramic main body, respectively; and a nano thin film layer formed of electric insulation material and applied to a region including the upper electrodes, wherein the nano thin film layer is applied by an atomic layer deposition process. At this time, the atomic layer deposition process may be performed at the deposition temperature of 80 to 350° C.

Furthermore, $Al_2O_3$ layer is formed as the nano thin film layer, the atomic layer deposition process is performed at the deposition temperature of 80 to 200° C., the aluminum supplying source is trimethyl aluminum (TMA; $Al(CH_3)_3$) and the process cycle including supplying the aluminum supplying source for 0.1 to 1.5 seconds, supplying an inert gas for 30 to 100 seconds to perform a purge, then supplying the oxygen supplying source for 0.1 to 1.5 second and supplying the inert gas for 30 to 100 seconds to perform a purge is repeatedly carried out.

Furthermore, the atomic layer deposition apparatus of the present disclosure includes a chamber unit provided with a chamber housing into a processing gas flow and a heating means for heating an interior of the chamber housing; a rotating unit provided with a rotating housing coupled with the chamber housing to be rotated about a horizontal central axis in the chamber housing, the processing gas flowing into the rotating housing through one side the rotating housing and being discharged through the other side of the rotating housing, the rotating unit being provided with a rotating means for rotating the rotating housing; a gas supplying unit provided with a gas supplying source in which the processing gas is stored, a gas supplying line connecting the gas supplying source and the chamber housing and a control valve installed on the gas supplying line to control a flow of the processing gas; and an exhaust unit connected to the other side of the chamber housing to discharge the processing gas. At this time, an interior of the rotating housing may be filled with laminated ceramic chip components.

Also, the chamber housing may be provided with a hollow cylindrical tube configured to have one side and the other side which are opened, the cylindrical tube being provided with a gas discharging hole formed on the other side; one side wall blocking one end of the cylindrical tube and having a gas supplying hole penetrating from one surface to the other surface thereof; and the other side wall blocking the other end of the cylindrical tube.

In addition, the rotating housing is provided with a hollow rotating cylindrical tube configured to have one side and the other side which are opened, one side rotating wall blocking one end of the rotating cylindrical tube and having one side through holes to which the processing gas flows; and the other side rotating wall blocking the other end of the rotating cylindrical tube and having the other side through holes through which the processing gas is discharged, wherein the total area of the one side through holes is greater than that of the other side through holes.

Furthermore, the rotating housing includes a hollow rotating cylindrical tube configured to have one side and the other side which are opened; one side rotating wall formed as a mesh net and coupled to one end portion of the rotating cylindrical tube; and the other side rotating wall formed as a mesh net and coupled to the other end portion of the rotating cylindrical tube, wherein the total area of the one side through holes formed on the mesh net of the one side rotating wall may be greater than that of the other side through holes formed on the mesh net of the other side rotating hole.

In addition, the rotating unit further includes a rotating shaft penetrating from one side of the rotating housing to the other side and is coupled to the rotating housing so that its central axis coincides with the central axis of the rotating housing, and the rotating shaft may be configured to be rotated by the rotating means.

Also, the gas supplying source includes a first source gas source for supplying a first source gas which is a supplying source of metallic element, a second source gas source for supplying a second source gas which is a supplying source of oxygen or nitrogen and a purge gas source for supplying a purge gas, the gas supplying line includes a first source line connected to the first source gas source, a second source line connected to the second source gas source and a purge line connected to the purge gas source, and the control valve may include a first control valve connected to the first source line, a second control valve connected to the second source line and a purge valve connected to the purge line. Here, the second source gas may be water vapor, oxygen ($O_2$), ozone or oxygen plasma.

Also, the chamber unit further includes a gas supplying pipe connecting the gas supplying hole and the gas supplying unit and a gas discharging pipe connecting the gas discharging hole and the exhaust unit, and the exhaust unit may include a vacuum pump connected to the gas discharging pipe.

Advantageous Effects

The laminated ceramic chip component provided with the nano thin film layer and the method for manufacturing the same of the present disclosure have an effect that since the nano thin film layer is formed on a region including a region of the external electrode part which is in contact with the mounting nozzle, the external electrode part is easily separated from the mounting nozzle.

Furthermore, the laminated ceramic chip component provided with the nano thin film layer and the method for manufacturing the same of the present disclosure is advantageous in that since the nano thin film layer is formed with a thickness in the nanometer range, the nano thin film layer applied to the external electrode part on a lower surface of an external electrode part is easily moved when the laminated ceramic chip component is surface-mounted to a circuit substrate.

The atomic layer deposition apparatus of the present disclosure has an effect of being capable of forming the nano thin film layer on a surface of small-sized the laminated ceramic chip component such as a laminated ceramic capacitor.

In addition, the atomic layer deposition apparatus of the present disclosure has an effect of being capable of forming the nano thin film layer on the surface of the laminated ceramic chip component in a large amount.

BRIEF DESCRIPTION OF THE DRAWINGS

FIG. 1 is a plane view of a laminated ceramic capacitor provided with a nano thin film layer according to one embodiment of the present disclosure;

FIG. 2 is a vertical sectional view taken along the line A-A in FIG. 1;

FIG. 3 and FIG. 4 are graphs representing a change in deposition rate of AL2O3 layer according to the supply time of an oxygen supplying source and an aluminum supplying source;

FIG. 5 is a graph representing a change in deposition rate of AL2O3 layer according to a deposition temperature in an atomic layer depositing process;

FIG. 6 is a graph representing a change in deposition thickness of AL2O3 layer according to the number of process cycles in an atomic layer depositing process;

FIG. 7 is an optical photograph of an upper surface of a laminated ceramic capacitor on which a nano thin film layer is formed by an atomic layer deposition process;

FIG. 8, FIG. 9 and FIG. 10 are graphs showing X-ray photoelectron spectroscopy ("XPS") analysis results for the zone I in FIG. 7;

FIG. 11, FIG. 12 and FIG. 13 are graphs showing XPS analysis results for the zone II in FIG. 7;

FIG. 14, FIG. 15 and FIG. 16 are graphs showing XPS analysis results for the zone III in FIG. 7;

FIG. 17 is a plane photographs showing a state in which a laminated ceramic capacitor provided with a nano thin film layer according to an embodiment of the present disclosure is adsorbed onto and is then separated from a mounting nozzle;

FIG. 18 is a plane photographs showing a state in which a laminated ceramic capacitor which is not provided with a nano thin film layer is adsorbed onto and is then separated from a mounting nozzle;

FIG. 19 is a scanning electron microscope photograph of an Al2O3 layer formed by an atomic layer deposition process;

FIG. 20 is a vertical sectional view of an atomic layer deposition apparatus according to one embodiment of the present disclosure;

FIG. 21 is a cross-sectional view taken along the line A-A in FIG. 20;

FIG. 22 is a cross-sectional view taken along the line B-B in FIG. 20;

FIG. 23 is a cross-sectional view taken along the line C-C in FIG. 20; and.

FIG. 24 is a plane view of a mesh net.

MODE FOR CARRYING OUT THE INVENTION

Hereinafter, a laminated ceramic chip component provided with a nano thin film layer, a method for manufacturing the same and an atomic layer deposition apparatus therefor according to the present disclosure are described in detail with reference to the accompanying drawings.

First of all, a laminated ceramic chip component provided with a nano thin film layer according to one embodiment of the present disclosure is described.

FIG. 1 is a plane view of a laminated ceramic capacitor provided with a nano thin film layer according to one embodiment of the present disclosure. FIG. 2 is a vertical sectional view taken along the line A-A in FIG. 1.

Referring to FIG. 1 and FIG. 2, a laminated ceramic chip component 100 according to one embodiment of the present disclosure is formed to include an element part 110, an external electrode part 120 and a nano thin film layer 130. The laminated ceramic chip component 100 is formed to have an approximately rectangular parallelepiped shape, and is conveyed to a circuit board in a state in which an upper surface of the laminated ceramic chip component is adsorbed onto a mounting nozzle. Then, a lower surface of the laminated ceramic chip component is placed on and soldered to an electrode pad of the circuit board, whereby the laminated ceramic chip component is surface-mounted to the circuit board. The laminated ceramic chip component is formed such that an external electrode, the element part 110 and the external electrode part 120 are sequentially placed with respect a widthwise direction (a horizontal direction in FIG. 1) on the upper surface.

The laminated ceramic chip component 100 may be a laminated ceramic capacitor, a laminated chip inductor, a laminated power inductor or a laminated chip bead. In the laminated ceramic chip component 100, the specific configuration of the element part 110 may be modified depending on the type of the chip component, and the external electrode part 120 and the thin film coating layer 130 are formed to have the same or similar configuration.

Therefore, the case where the laminated ceramic chip component 100 is a laminated ceramic capacitor will be described below. In the laminated ceramic chip capacitor 100, the element part 110 and the external electrode part 120 are formed to have a conventional configuration, and the nano thin film layer 130 is additionally formed. Meanwhile, even when the laminated ceramic chip component 100 is formed as the laminated chip inductor, the laminated power inductor or the laminated chip bead, the element part 110 and the external electrode part 120 are formed to have a general configuration. Therefore, a detail description on the case where the laminated ceramic chip component is formed as the laminated chip inductor, the laminated power inductor or the laminated chip bead will be omitted.

The element part 110 is formed to include a ceramic main body 111 and an internal electrode 112. The element part 110 is formed to be the same as or similar to that of a conventional laminated ceramic capacitor.

Although not specifically shown in the drawing, the ceramic main body 111 is formed by a burning process after stacking a plurality of dielectric layers. The ceramic main body 111 is formed to have a shape of the laminated ceramic capacitor, and is formed in an approximately rectangular parallelepiped shape. The ceramic main body 111 is the part that contributes to a formation of capacitance of the laminated ceramic capacitor. Depending on the required capacitance, the dielectric layer is formed to have a predetermined thickness and the number of the dielectric layers is determined.

The internal electrode 112 is formed to include a first internal electrode 112a and a second internal electrode 112b. The first internal electrode 112a and the second internal electrode 112b have different polarities and are alternately disposed while being spaced apart from each other in an interior of the ceramic main body 111. The first internal electrode 112a and the second internal electrode 112b are formed such that their end portions are exposed at one side surface and the other side surface of the ceramic main body 111, respectively. The first internal electrode 112a and the second internal electrode 112b are electrically isolated from each other by the dielectric layer of the ceramic main body 111 disposed therebetween. The first internal electrode 112a and the second internal electrode 112b are exposed through both side surfaces of the ceramic main body 111 and are electrically connected to the external electrode part 120, respectively.

Meanwhile, in the case where the laminated ceramic chip component 100 is formed as the laminated chip inductor or the laminated power inductor, a plurality of the internal electrodes 112 may be interlayer-connected to each other through via holes (not shown) formed in the dielectric layer in an interior of the ceramic main body 111 to form a coil pattern.

The external electrode part 120 is formed to include a first external electrode 121 and a second external electrode 122. The external electrode part 120 is formed to wrap both side surfaces and portions of upper and lower surfaces of the element part 110. More specifically, the first external electrode 121 and the second external electrode 122 are formed to include side electrodes 121a, 122a covering both side surfaces of the ceramic main body 111, respectively, upper electrodes 121b, 122b covering portions of both sides of an upper surface of the ceramic main body, respectively, and lower electrodes 121c, 122c covering portions of both sides of a lower surface of the ceramic main body, respectively. In addition, the first external electrode 121 and the second external electrode 122 may be formed to further include a front electrode 121d and a rear electrode 122d which correspond to the upper and lower surface of the ceramic main body and cover a front surface and a rear surface, respectively. Here, the side electrodes 121a, 122a, the upper electrodes 121b, 122b, the lower electrodes 121c, 122c and the front/rear electrodes 121d/122d are applied to the first external electrode 121 and the second external electrode 122 in the same manner. The upper electrodes 121b, 122b, the lower electrodes 121c, 122c and the front/rear electrodes 121d/122d are formed to have a predetermine width. In addition, the first external electrode 121 and the second external electrode 122 are formed to be spaced apart from each other on the upper surface, the lower surface, and the front and rear surfaces of the ceramic main body. In other words a portion of the outer surface of the ceramic main body is formed to expose between the first external electrode 121 and the second external electrode 122. The side electrodes 121a, 122a, the upper electrodes 121b, 122b, the lower electrodes 121c, 122c and the front/rear electrodes 121d/122d may be formed integrally with each other. The first external electrode 121 and the second external electrode 122 are electrically connected to the first internal electrode 112a and the second internal electrode 112b, respectively, on both side faces of the ceramic main body 111 to and supply the electric power.

The external electrode part 120 may be formed of metal such as argentum (Ag), stannum (Sn) or nickel.

The nano thin film layer 130 is formed in a region including an outer surface of the external electrode part 120 positioned on the upper surface of the ceramic body 111. That is, the nano thin film layer 130 is preferably formed in a region including outer surfaces of the upper electrodes 121b, 122b of the external electrode part 120. In addition, the nano thin film layer 130 may be formed entirely on the outer surface of the external electrode part 120. That is, the nano thin film layer 130 may also be formed on outer surfaces of the side electrodes 121a, 122a, the upper electrodes 121b, 122b, the lower electrodes 121c, 122c, and the front/rear electrodes 121d/122d of the external electrode part 120. In addition, the nano thin film layer 130 may be formed on an outer surface of the ceramic main body 111 exposed between the external electrode parts 120. That is, the nano thin film layer 130 may be formed on the outer surface of the ceramic main body 111 exposed between the first external electrode 121 and the second external electrode 122.

The nano thin film layer 130 is in direct contact with a mounting nozzle formed of a ceramic to prevent the external electrode part 120 formed of metallic material from being in direct contact with the mounting nozzle. That is, the nano thin film layer 130 blocks a contact between the metal and the ceramic, and causes a contact between the ceramic and the ceramic to be made. Since the external electrode part 120 is formed of metal material, when the external electrode part is adsorbed onto the mounting nozzle by vacuum pressure, the external electrode part 120 is deformed by the mounting nozzle and temporarily adhered to the mounting nozzle. Therefore, even when the vacuum pressure is removed, a phenomenon that the external electrode portion is not separated from the mounting nozzle may occur. However, since the nano thin film layer 130 is formed of ceramic material, even if the nano thin film layer 130 is adsorbed to the mounting nozzle, the nano thin film layer 130 is easily separated from the mounting nozzle when the vacuum pressure is removed. Accordingly, the nano thin film layer 130 allows the laminated ceramic capacitor to be easily separated from the mounting nozzle during a mounting process The nano thin film layer 130 is formed as a thin film having a nano thickness, and is formed to have a thickness of 0.5 to 400 nm, preferably 1 to 100 nm. If the thickness of the nano thin film layer 130 is too small, a physical contact between the mounting nozzle and the external electrode cannot be sufficiently blocked. Also, if the nano thin film layer 130 is too thick, the process cost is unnecessarily increased. Furthermore, if the nano thin film layer 130 is too thick, in the case where the nano thin film layer 130 is formed on the surface of the lower electrode, the nano thin film layer may not be removed when the laminated ceramic chip component is soldered to the electrode pad of the circuit board. If the nano thin film layer 130 applied to the lower electrode is not removed, electrical contact between the lower electrode and the electrode pad of the circuit board may not be sufficient.

The nano thin film layer 130 may be formed by a method such as an atomic layer deposition (ALD) method, a physical vapor deposition (PVD) method such as a sputtering method, and a chemical vapor deposition (CVD) method. Preferably, the nano thin film layer 130 may be formed by the atomic layer deposition method, which facilitates controlling the thickness of the thin film. In addition, if the nano thin film layer is formed by the atomic layer deposition process, a surface hardness of the nano thin film layer 130 is lowered so that it is possible to more effectively reduce the compression phenomenon.

The nano thin film layer 130 may be formed of oxide, nitride having an electric insulation property, or a compound thereof. The oxide may be any one selected from the group consisting of $Al_2O_3$, $HfO_2$, $ZrO_2$, $La_2O_3$, $SiO_2$, $Ta_2O_5$, $Nb_2O_5$, $Y_2O_3$, $SrTiO_3$, $BaTiO_3$, or a compound thereof. In addition, the nitride may be formed of any one selected from the group consisting of AlN and $SiN_x$, or a compound thereof.

Next, a method for manufacturing parts constituting the laminated ceramic chip component provided with the nano thin film layer according to one embodiment of the present disclosure is described below.

As described above, the laminated ceramic chip component 100 according to one embodiment of the present disclosure is provided with the element part 110, the external electrode part 120 and the nano thin film layer 130, the element part 110 and the external electrode part 120 have the configuration which is the same as or similar to that in the conventional chip component and the process for manufacturing the same is also the same as or similar to that for the conventional chip. Thus, a specific description on the manufacturing process is omitted herein.

Therefore, the following description will focus on the process of forming the nano thin film layer 130 of the laminated ceramic chip component 100 using the atomic layer deposition process. The nano thin film layer 130 may be formed of the oxide, the nitride having the insulation property, or a compound thereof as described above, and may be formed by the atomic layer deposition process.

In the atomic layer deposition process, a deposition temperature is maintained at 80 to 350° C., a metal ion supplying source of the oxide or the nitride and an oxygen supplying source or a nitrogen supplying source are alternately supplied, and inert gas is purged in the middle of the process. Water vapor, oxygen, ozone or oxygen plasma may be employed as the oxygen supplying source. Here, the deposition temperature may be a temperature in a vacuum chamber in which the atomic layer deposition process is performed. The deposition temperature is appropriately set within the above range depending on the kind of the metal ion source of the oxide or nitride used in the deposition process, and in particular, the deposition temperature is set within a range that does not affect a deposition rate of the thin film. If the deposition temperature is too low, the deposition rate is reduced due to incomplete reaction between the metal ion supplying source and the oxygen supplying source or the nitrogen supplying source. In addition, if the deposition temperature is too low, the precursor is not fully decomposed, but is condensed due to incomplete reaction of the precursor, and the deposition rate may be increased to a thin film state in which the film quality is poor. If the deposition temperature is too high, the deposition rate is reduced by a re-evaporation. In addition, if the deposition temperature is too high, the chemical vapor deposition process may be proceeded together with the atomic layer deposition process so that the deposition rate may be increased, which may make it difficult to control the thickness of the nano thin film layer.

Next, the atomic layer deposition process for forming an $Al_2O_3$ layer as the nano thin film layer 130 will be described.

TMA (trimethyl aluminum: $Al(CH_3)_3$) may be used as an aluminum supplying source for forming the $Al_2O_3$ layer, and water vapor ($H_2O$) may be used as an oxygen supplying source. In addition, in the atomic layer deposition process, supplying the aluminum supplying source for 0.1 to 1.5 seconds while maintaining the deposition temperature of 80 to 200° C., supplying the inert gas for 30 to 100 seconds to perform a purge, supplying the oxygen supplying source for 0.3 to 1.5 seconds and supplying the inert gas for 30 to 100 seconds to perform a purge are regarded as one process cycle and this process cycle is repeated dozens of times to hundreds of times. Referring to FIG. 3 and FIG. 4, the deposition rate is constant when the supply time of the oxygen supplying source is 0.3 to 0.5 seconds, and the deposition rate is constant when the supply time of the aluminum supplying source is 0.1 to 0.5 second. In the deposition temperature is preferably maintained in the temperature range of 80 to 200° C., and the temperature does not affect the deposition rate in this temperature range. Referring to FIG. 5, it can be seen that the deposition rate is constant in the temperature range of 80 to 200° C. of the vacuum chamber. It is also preferable that the pipe for supplying the aluminum supplying source and the oxygen supplying source is maintained at approximately 80° C. According to the experimental result, referring to FIG. 6, it could be confirmed that when the nano thin film layer 130 was subjected to 50, 100, 150 and 200 process cycles, this film layer has a thickness of 60 to 220 Å and the layer with a thickness of about 0.1 nm was formed per cycle. At this time, the temperature of the vacuum chamber was set to 80° C., the process cycle including supplying the aluminum supplying source for 0.3 seconds, supplying the argon gas for 30 seconds to perform a purge, then supplying the oxygen supplying source for 0.3 second and supplying the argon gas for 30 seconds to perform a purge was repeated. The number of cycles of the atomic layer deposition process could be appropriately controlled according to the thickness of the nano thin film layer.

Next, the atomic layer deposition process in which $Al_2O_3$ film is formed as the nano thin film layer will be described with reference to a more specific embodiment.

On the laminated ceramic chip component 100, an $Al_2O_3$ film was formed as the nano thin film layer 130 by the atomic layer deposition process. At this time, the atomic layer deposition process was performed by supplying TMA that is the aluminum supplying source and $H_2O$ that is the oxygen supplying source for 1 second, respectively and performing a purge for 90 seconds, and 100 process cycles were performed at the temperature of 150° C. As can be seen from FIG. 7, it was confirmed that the nano thin film layer was entirely formed on the region including the upper surface of the laminated ceramic capacitor. In order to verify this, the top surface of the laminated ceramic capacitor was divided into three zones, and the analysis was performed for checking whether the $Al_2O_3$ film existed on each zone. In the laminated ceramic capacitor, upper portions of the external electrode parts were set as the zone I and the zone III, respectively, and an upper portion of the element part located between them was set as the zone II. The analysis was carried out by X-ray photoelectron spectroscopy (XPS) for three regions on the upper surface of the laminated ceramic capacitor. In the zone I, the Al 2p peak was located at 73.08 eV as shown in FIG. 8, the O 1s peak was located at 530.08 eV as shown in FIG. 9 and Sn 3d peak, which is a component of the external electrode part peak, was found as shown in FIG. 10. It the zone II, it was confirmed that the Al 2p peak was located at 73.28 eV as shown in FIG. 11 and the O 1s peak was located at 530.28 eV as shown in FIG. 12. However, as shown in FIG. 13, the Sn 3d peak was hardly found so that it can be seen that there is a difference from the zone I. In the zone III, the Al 2p peak was located at 73.18 eV as shown in FIG. 14, the O 1s was located at 529.98 eV as shown in FIG. 15, and Sn 3d peak, which is a component of the external electrode part peak, was found as shown in FIG. 16. Therefore, it can be confirmed that the nano thin film layer was uniformly and entirely deposited on the upper surface of the external electrode part and the upper surface of the element part by the $Al_2O_3$ thin film.

Also, after the multi-layer ceramic capacitor having the nano thin film layer formed thereon was adsorbed onto the mounting nozzle and was then moved, the multi-layer ceramic capacitor was separated from the mounting nozzle. As a result, the laminated ceramic capacitor was easily separated from the mounting nozzle. Also, referring to FIG. 17, no mark caused by the mounting nozzles was observed on the upper surface of the laminated ceramic capacitor. A groove formed horizontally on the upper side of the electrode shown in FIG. 17 was formed when the laminated ceramic capacitor was picked up and transferred by tweezers after the evaluation was completed.

For comparison, the same evaluation was performed for the laminated ceramic capacitor on which a nano thin film layer was not formed. As a result, after the laminated ceramic capacitor was adsorbed onto the mounting nozzle, the electrode was deformed and the laminated ceramic capacitor was tightly trapped into the mounting nozzle so that laminated ceramic capacitor was not easily separated from the mounting nozzle. In addition, as shown in FIG. 18, it can be seen that, on the upper surface of the multilayer ceramic capacitor which was in contact with the mounting nozzle, the electrode portion was deformed by the strong mechanical pressing caused by the mounting nozzle.

In order to evaluate the uniformity of the thickness of the deposited nano thin film, the $Al_2O_3$ film was deposited on a silicon wafer using the atomic layer deposition process. In the atomic layer deposition process, $Al(CH_3)_3$ was used as the aluminum supplying source and water vapor ($H_2O$) was used as the oxygen supplying source. In the atomic layer deposition process, supplying the aluminum supplying source for 0.3 seconds, supplying the argon gas for 30 seconds to perform a purge, supplying the oxygen supplying source for 0.3 to 1.5 seconds and supplying the argon gas for 30 seconds to perform a purge are regarded as one process cycle and this process cycle is repeated 50 times. At this time, the process chamber was maintained at the temperature of 80° C., and the lines for supplying the aluminum supplying source and the oxygen supplying source were maintained at the temperature of 80° C. In a case where 50 process cycles were performed, the measured total thickness of the oxide nano-coating layer was 63.5 Å and the measured thickness uniformity was 3.8%. Referring to FIG. 19, in addition, when 160 process cycles in the atomic layer deposition process were performed, the measured thickness of the oxide nano-coating layer was 17.9 nm.

Hereinafter, an atomic layer deposition apparatus of the present disclosure is specifically described with reference to the accompanying drawings.

First of all, an atomic layer deposition apparatus according to one embodiment of the present disclosure is described.

FIG. 20 is a vertical sectional view of an atomic layer deposition apparatus according to one embodiment of the present disclosure. FIG. 21 is a cross-sectional view taken along the line A-A in FIG. 20. FIG. 22 is a cross-sectional view taken along the line B-B in FIG. 20. FIG. 23 is a cross-sectional view taken along the line C-C in FIG. 20. FIG. 24 is a plane view of a mesh net.

Referring to FIG. 20 to FIG. 24, an atomic layer deposition apparatus according to one embodiment of the present disclosure is formed to include a chamber unit 200, a rotating unit 300, a gas supplying unit 400 and an exhaust unit 500.

The atomic layer deposition apparatus is an apparatus for forming a nano thin film layer that is formed of an oxide or a nitride, on the surface of the chip component having a size of several mm or less like the laminated ceramic chip component 100 through the atomic layer deposition process. The nano thin film layer may be formed of the oxide, the nitride having the electric insulation property, or a compound thereof. The oxide may be any one selected from the group consisting of $Al_2O_3$, $HfO_2$, $ZrO_2$, $La_2O_3$, $SiO_2$, $Ta_2O_5$, $Nb_2O_5$, $Y_2O_3$, $SrTiO_3$, $BaTiO_3$ or a compound thereof. In addition, the nitride may be formed of any one selected from the group consisting of AlN and $SiN_x$, or a compound thereof. In addition, the nano thin film layer is formed as a thin film having a nano thickness, and may be formed to have a thickness of 0.5 to 400 nm, preferably 1 to 100 nm.

In the atomic layer deposition apparatus, the processing gas including a source gas supplying metallic elements depending on component of the nano thin film layer to be formed, a source gas supplying oxygen or nitrogen and a purge gas which is an inert gas such as argon gas is supplied into the chamber unit 200. Water vapor, oxygen ($O_2$), ozone ($O_3$) or oxygen plasma may be employed as the second source gas.

In the atomic layer deposition apparatus, in addition, the nano thin film layer is formed on the surface of the laminated ceramic chip component 100 by bringing the supplied processing gas into contact with the surface of the laminated ceramic chip component contained in the rotating unit 300. The atomic layer deposition apparatus rotates the laminated ceramic chip component 100 in an upward/downward direction in the rotating unit 300 so that the laminated ceramic chip component 100 is brought into a more uniform contact with the processing gas to form the uniform nano thin film layer on the surface. Here, the laminated ceramic chip component 100 may be a laminated ceramic capacitor, a laminated chip inductor, a laminated power inductor or a laminated chip bead.

The chamber unit 200 includes a chamber housing 210, a gas supplying pipe 220, a gas discharging pipe 230 and a heating means 240. In the chamber unit 200, the rotating unit 300 is accommodated in the chamber housing 210 and an interior of the chamber housing 210 is heated by the heating means 240. In the chamber unit 200, in addition, the processing gas is supplied into the chamber housing 210 through the gas supplying pipe 220, and the processing gas used in the deposition process is discharged to an outside of the chamber housing 210 through the gas discharging pipe 230.

The chamber housing 210 may be formed to include a cylindrical tube 211, one side wall 213 and the other side wall 215. The processing gas for forming the nano thin film layer flows into the chamber housing 210. The chamber housing 210 is formed in an approximately cylindrical shape having a predetermined housing diameter and a housing length, and a central axis is disposed in a horizontal direction. The chamber housing 210 is formed of corrosion-resistant metal such as stainless steel or titanium.

The cylindrical tube 211 is formed to include a gas discharging hole 211a. The cylindrical tube 211 is hollow and has a cylindrical shape with one side and the other side which are opened. Therefore, the cylindrical tube 211 is formed to have a circular vertical cross-section. However, the cylindrical tube 211 may be formed to have a polygonal vertical cross-section such as a rectangular or a hexagonal vertical cross-section.

The gas discharging hole 211a is formed at the other side of the of the cylindrical tube 211. The gas discharging hole 211a provides a path for discharging the processing gas used in the atomic layer deposition process to the outside of the chamber housing 210.

The one side wall 213 is formed to include a gas supplying hole 213a. The one side wall 213 may be formed to further include a first shaft hole 213b. Depending on a structure of the rotating unit 300, the first shaft hole 213b may be omitted. For example, the first shaft hole 213b may be omitted if one side of a rotating shaft 320 of the rotating unit 300, which will be described below, is supported on the chamber housing 210.

The one side wall 213 has a plate shape and may be formed in a shape corresponding to one end of the circular tube 211. For example, when one end of the cylindrical tube 211 is formed in a circular shape, the one side wall 213 is also formed in a circular shape. The one side wall 213 is coupled to one end of the circular tube 211 to block one end of the circular tube 211.

The gas supplying hole 213a is formed to penetrate from one surface of the one side wall 213 to the other surface. The gas supplying hole 213a is formed to have a circular shape, a square shape or a polygonal shape. The gas supplying hole 213a is preferably formed to be positioned at an upper portion with respect to a horizontal line perpendicular to the central axis of the chamber housing 210. The gas supplying hole 213a provides a path through which the supplied gas is supplied into the chamber housing 210

The first shaft hole 213b is formed to penetrate from one surface of the one side wall 213 to the other surface. The first shaft hole 213b is formed such that its center lies at a position at which the central axis of the chamber housing 210 lies. The first shaft hole 213b provides a path by which the rotating shaft 320 of the rotating unit 300 is coupled.

The other side wall 215 may be formed to further include a second shaft hole 215a. Depending on a structure of the rotating unit 300, the second shaft hole 215a may be omitted. For example, the second shaft hole 215a may be omitted if the other side of the rotating shaft 320 of the rotating unit 300 is supported on the chamber housing 210.

The other side wall 215 has a plate shape and may be formed in a shape corresponding to the other end of the circular tube 211. For example, when the other end of the cylindrical tube 211 is formed in a circular shape, the other side wall 215 is also formed in a circular shape. The other side wall 215 is coupled to the other end of the circular tube 211 to block the other end of the circular tube 211.

The second shaft hole 215a is formed to penetrate from one surface of the other side wall 215 to the other surface. The second shaft hole 215a is formed such that its center lies at a position at which the central axis of the chamber housing 210 lies. The second shaft hole 215a provides a path by which the rotating shaft 320 of the rotating unit 300 is coupled.

The gas supplying pipe 220 is formed as a piping and is coupled to the gas supplying hole 213a formed on the one side wall 213 of the chamber housing 210. The gas supplying pipe 220 is connected to the gas supplying unit 400 and provides a path through which the gas supplied from the gas supplying unit 400 is supplied into the chamber housing 210.

The gas discharging pipe 230 is formed as a piping and is coupled to the gas discharging hole 211a formed in the other side of the circular tube 211 of the chamber housing 210. The gas discharging pipe 230 is connected to the exhaust unit 500 and provides a path through which the processing gas used in the atomic layer deposition process is discharged to the outside of the chamber housing 210.

The heating means 240 is placed outside or inside the chamber housing 210 and heats the interior of the chamber housing 210. The heating means 240 may be formed to have a cylindrical or arcuate shape corresponding to the outer shape of the chamber housing 210 so that the heating means entirely surrounds the outside of the chamber housing 210. In addition, the heating means 240 may be formed in a rod shape and may be formed to be disposed outside the chamber housing 210 at predetermined intervals along the circumferential direction.

The rotating unit 300 includes a rotating housing 310, the rotating shaft 320 and a rotating means 330.

In the rotating unit 300, the laminated ceramic chip component 100 on which the nano thin film layer is formed is accommodated in the rotating housing 310. In addition, the rotating unit 300 allows the laminated ceramic chip component 100 to be exposed to the supplied gas when the rotating housing 310 is rotated by the rotating means 330 together with the rotating shaft 320.

The rotating housing 310 may be formed to include a rotating cylindrical tube 311, one side rotating wall 313 and the other side rotating wall 315. The rotating housing 310 is formed in an approximately cylindrical shape having a predetermined rotation diameter and rotation length, and is disposed to allow its central axis to be arranged in a horizontal direction. The rotating housing 310 is coupled to be rotated about a horizontal central axis in the chamber housing 210. In addition, the rotating housing 310 may be formed to allow the one rotating wall 313 or the other rotating wall 315 to be separated from the rotating cylindrical tube 311. Accordingly, the rotating housing 310 allows the laminated ceramic chip component 100 to be received therein after the one rotating wall 313 or the other rotating wall 315 is separated from the rotating cylindrical tube 311. In addition, the rotating housing 310 is coupled to the interior of the chamber housing 210 such that a central axis of the rotating housing is preferably coincident with the central axis of the chamber housing 210. The rotating housing 310 is formed of metal material such as stainless steel having corrosion resistance.

In addition, an outer circumferential surface of the rotating cylindrical tube 311 of the rotating housing 310 faces an inner circumferential surface of the cylindrical tube 211 of the chamber housing 210, and separate shield material is disposed between the outer circumferential surface of the rotating cylindrical tube 311 and the inner circumferential surface of the cylindrical tube 211 to prevent the processing gas from being leaked. However, the rotating cylindrical tube 311 is formed so as not to be directly coupled with the inner circumferential surface of the cylindrical tube 211 because it is rotated.

The rotating cylindrical tube 311 is hollow and is formed in a shape having both opened sides.

The one side rotating wall 313 is formed to include one side through holes 313.

The one side rotating wall 313 is coupled to one end of the rotating cylindrical tube 311 to block one end of the rotating cylindrical tube 311. Accordingly, the one side rotating wall 313 may be formed in a circular shape having a diameter corresponding to that of the rotating cylindrical tube 311. Meanwhile, the one side rotating wall 313 may be formed of a general mesh net shown in FIG. 24. The mesh net is formed to have a structure in which wires are mutually and orthogonally intersected and coupled to each other to form one side through holes 313a. The one side through hole 313a is formed in a square shape and the one side through holes are densely arranged so that the mesh net allows the processing gas to flow more smoothly.

The one side through hole 313a is formed to penetrate from one surface of the one side rotating wall 213 to the other surface. The one side through hole 313a is configured to have a predetermined diameter or area, and the diameter of one side of the one side through hole is smaller than the size of the laminated ceramic chip component 100 accommodated in the rotating housing 310. Therefore, the one-side through holes 313a prevent the laminated ceramic chip component 100 accommodated in the rotating housing from being escaped out of the rotational housing 310 during a rotation of the rotating housing 310. The one side through holes 313a are formed so as to be distributed throughout the one side rotating wall 313.

The one side through hole 313a allows the processing gas supplied through the gas supplying hole 213a to flow into the rotating housing 310.

The other side rotating wall 315 is formed to include other side through holes 315a.

The other side rotating wall 315 is coupled to the other end of the rotating cylindrical tube 311 to block the other end of the rotating cylindrical tube 311. Accordingly, the other side rotating wall 315 may be formed in a circular shape having a diameter corresponding to that of the rotating cylindrical tube 311. Meanwhile, the other side rotating wall 315 may be formed of a general mesh net. The mesh net is formed to have a structure in which wires are mutually and orthogonally intersected and coupled to each other to form the other side through holes 315*a*. The one side through hole 313*a* is formed in a square shape and the other side through holes are densely arranged so that the mesh net allows the processing gas to flow more smoothly.

The other side through hole 315*a* is formed to penetrate from one surface of the other side rotating wall 315 to the other surface. The other side through hole 315*a* is configured to have a predetermined diameter or area, and the diameter of other side of the other side through hole is smaller than the size of the laminated ceramic chip component 100 accommodated in the rotating housing 310. Therefore, the other through holes 315*a* prevent the laminated ceramic chip component 100 accommodated in the rotating housing from being escaped out of the rotational housing 310 during a rotation of the rotating housing 310. The other side through holes 315*a* are formed so as to be distributed throughout the other side rotating wall 315. The other side through holes 315*a* provide a path through which the processing gas in the rotating housing 310 is discharged to the outside of the rotating housing 310.

In addition, the other side through holes 315*a* are formed to have the total area which is smaller than that of the one side through holes 313*a*. Preferably, the other side through hole 315*a* is formed to have a diameter which is smaller than that of the one side through hole 313*a*. When the other side through holes 315*a* are formed to have an area which is smaller area than that of the one side through holes 313*a*, the amount of the processing gas discharged to the outside of the rotating housing 310 through the other side through holes 315*a* becomes larger than that of the processing gas flowing into the rotary housing 310 through the one side through holes 313. Accordingly, a positive pressure is generated in the rotating housing 310 and the probability that the processing gas becomes in contact with the surface of the laminated ceramic chip component 100 is increased. Consequently, the more uniform nano thin film layer can be formed on the surface of the laminated ceramic chip component 100.

The rotating shaft 320 is formed in a pillar or a bar shape, and penetrates from one side of the rotating housing 310 to the other side and is coupled to the rotating housing so that a central axis of the rotating shaft coincides with the central axis of the rotating housing 310. Meanwhile, the rotating shaft 320 may be formed to be coupled to the outer surface of the one side rotating wall 313 or the other side rotating wall 315. In this case, the rotating shaft 320 does not penetrate into the rotating cylindrical tube 311. The rotating shaft 320 may pass through the one side wall 213 and the other side wall 215 of the chamber housing 210 and be coupled to the chamber housing to be exposed to the outside of the chamber housing 210. At this time, the rotating shaft 320 is coupled to the one side through hole 313*a* of the one side wall 213 and the other side through hole 315*a* of the other side wall 215. Meanwhile, the rotating shaft 320 may be formed such that only one side of the rotating shaft is exposed to the outside of the chamber housing 210. In this case, the rotating shaft may be rotatably supported by a separate support bar (not shown) located in the chamber housing 210 at a side thereof which is not exposed to the outside of the chamber housing 210.

The rotating means 330 is formed by a means such as a motor and is coupled to one side or the other side of the rotating shaft 320 to rotate the rotating shaft 320 and the rotating housing 310 coupled to the rotating shaft 320. The rotating means 330 is connected to the rotating shaft 320 through a separate belt or gear to rotate the rotating shaft.

The gas supply unit 400 is formed to include a gas supplying source 410, a gas supplying line 420 and a control valve 430. The gas supplying unit 400 supplies the processing gas including the source gas required for the atomic layer deposition process and the purge gas into the rotating housing 310.

A plurality of gas supply sources 410 may be provided depending on the source gas and the purging gas required for the atomic layer deposition process. In general, the atomic layer deposition process requires a first source gas for supplying the metallic element, a second source gas for supplying oxygen or nitrogen element, and a purge gas, which is an inert gas such as argon gas. For example, when $Al_2O_3$ film is formed as the nano thin film layer, an aluminum source gas, which is the first source gas, an oxygen source gas, which is the second source gas, and an argon gas, which is the purge gas, are required. Accordingly, the gas supplying source 410 may be formed to include a first source gas source 411, a second source gas source 413 and a purge gas source 415. In other words, the first source gas source 411 is filled with a source gas acting as an aluminum supplying source to supply it, the second source gas source 412 is filled with water vapor serving as an oxygen supply source to supply it, and the purge gas source 413 may be filled with an argon gas to supply it.

The gas supply line 420 connects the gas supplying source 410 and the chamber unit 200 to allow the processing gas of the gas supplying source 410 to be supplied to the chamber unit 200. The number of the gas supplying line 420 corresponds to that of the gas supplying sources 410. A first source line 421, a second source line 422 and a purge line 423 may be formed as the gas supplying line 420 when three gas supplying sources 410 are provided as described above. For example, the first source line 421 is connected to the first source gas source 411, the second source line 422 is connected to the second source gas source 412, and the purge line may be connected to the purge gas source 413.

The control valve 430 is installed in the middle of the gas supplying line 420 and controls a supply amount and a supply time of the processing gas supplied through the gas supplying line 420. The control valve 430 may be formed of a mass flow controller. Depending on the gas supplying line 420 to be installed, a first control valve 431, a second control valve 432 and a purge valve 433 may be provided as the control valve 430. For example, the first control valve 431 is coupled to the first source line 421, the second control valve 432 is coupled to the second source line 422, and the purge valve 433 is coupled to the purge line 423.

A vacuum pump is provided as the exhaust unit 500. The exhaust unit 500 is connected to the chamber housing 210 of the chamber part 200 to discharge in the chamber housing 210 to the outside.

Next, an operation of the atomic layer deposition apparatus according to one embodiment of the present disclosure is described below.

First of all, the laminated ceramic chip component 100 is mounted in the rotating housing 310. Preferably, at this time, the rotating housing 310 is partially filled with the laminated ceramic chip components 100. In this case, the laminated ceramic chip component 100 is alternately exposed to an upper space of the rotating housing 310 when the rotating housing 310 is rotated with respect to the rotating shaft 320 extending in the horizontal direction. Therefore, the nano thin film layer can be more efficiently formed on the surface of the laminated ceramic chip component 100.

Next, the rotating housing 310 is mounted in the chamber housing 210, and the rotating shaft 320 is rotated by the rotating means 330. The interior of the chamber housing 210 and the interior of the rotating housing 310 are heated to the processing temperature while the heating means 240 of the chamber unit 200 is operated. The processing temperature is set to 80 to 350° C. The exhaust unit 500 is operated to discharge the air in the chamber housing 210 to the outside. When the interior of the chamber housing 210 becomes in a vacuum state, the first control valve 431 is operated so that the first source gas stored in the first source gas source 411 is supplied through the first source line 421. At this time, the first source gas may be supplied for 0.1 to 1.5 seconds depending on a kind of the source gas supplied in a pulsed manner. Meanwhile, before the first source gas is supplied, the purge gas may be supplied to remove air remained in the chamber housing 210 and to purge the chamber housing. Subsequently, the purge valve 433 is operated to supply the purge gas stored in the purge gas source 413 into the chamber housing 210 through the pure line 423. At this time, the purge gas may be supplied for 30 to 100 seconds. Next, the second control valve 432 is operated to supply the second source gas stored in the second source gas source 412 through the second source line 422. At this time, the second source gas may be supplied for 0.1 to 1.5 seconds depending on a type of the source gas supplied in a pulsed manner. Next, the purge valve 433 is operated to supply the purge gas stored in the purge gas source 423 to the chamber housing 210 via the purge line. At this time, the purge gas may be supplied for 30 to 100 seconds. In the atomic layer deposition apparatus, the above procedures are regarded as one process cycle, and several tens to several hundred process cycles are repeated to form the nano thin film layer on the surface of the laminated ceramic chip component. The thickness of the nano thin film layer may be varied depending on the processing temperature and the number of process cycles. The nano thin film layer is formed as a thin film with a nano thickness, and is formed to have a thickness of 0.5 to 400 nm, and may be preferably formed to have a thickness of 1 to 100 nm.

The processing gas flowing into the chamber housing 210 through the gas supplying pipe 220 is supplied into the rotating housing 310 through the one side through holes 313a formed on the one side rotating wall 313 of the rotating housing 310. The processing gas flowing into the rotating housing 310 is in contact with the surface of the laminated ceramic chip component 100 and is then discharged to the outside of the rotating housing 310 through the other side through holes 315a of the other side rotating wall 315. At this time, the processing gas flows more smoothly into the upper region which is not filled with the laminated ceramic chip component 100 than the region where is filled with the laminated ceramic chip component 100. The processing gas flowing into the chamber housing 210 is discharged to the outside of the chamber housing 210 by the exhaust unit 500.

The atomic layer deposition apparatus allows the laminated ceramic chip component 100 which is exposed to the upper space in an internal space of the rotating housing 310 to be coated more efficiently while the rotating housing 310 is continuously rotated.

In addition, the atomic layer deposition apparatus is configured such that since the area or size of the one side through holes 313a of the one side rotating wall 313 of the rotating housing 310 is larger than the area or size of the other side through holes 315a of the other side rotating wall 315, the processing gas retention time in the rotating housing 310 is increased so that the nano thin film layer can be more efficiently formed.

INDUSTRIAL APPLICABILITY

The present disclosure can be employed for manufacturing the laminated ceramic chip component provided with the nano thin film layer which can be easily separated from the mounting nozzle when a vacuum pressure is removed after a small-sized laminated ceramic chip component such as a laminated ceramic capacitor is adsorbed onto the mounting nozzle.

The invention claimed is:

1. A method for manufacturing a laminated ceramic chip component provided with a nano thin film layer, the laminated ceramic chip component comprises;
   an element part including a ceramic main body and an internal electrode placed in the ceramic main body;
   an external electrode part including a first external electrode and a second external electrode, the first and second external electrodes being provided with side electrodes covering both side surfaces of the ceramic main body, respectively, upper electrodes covering portions of both sides of an upper surface of the ceramic main body, respectively, and lower electrodes covering portions of both sides of a lower surface of the ceramic main body, respectively; and
   a nano thin film layer formed of electric insulation material and applied to a region including the upper electrodes,
   wherein the nano thin film layer is applied by an atomic layer deposition process,
   wherein the nano thin film layer is formed of $Al_2O_3$ layer,
   wherein the atomic layer deposition process is performed at the deposition temperature of 80 to 200° C.,
   wherein the aluminum supplying source is trimethyl aluminum (TMA; $Al(CH_3)_3$),
   wherein a process cycle including supplying the aluminum supplying source for 0.1 to 1.5 seconds, supplying an inert gas for 30 to 100 seconds to perform a purge, then supplying the oxygen supplying source for 0.1 to 1.5 second and supplying the inert gas for 30 to 100 seconds to perform a purge is repeatedly carried out,
   wherein the nano thin film layer is removed when the laminated ceramic chip component is soldered to an electrode pad of a circuit board.

2. The method for manufacturing the laminated ceramic chip component provided with the nano thin film layer of claim 1, wherein the oxygen supplying source is water vapor, oxygen, ozone or oxygen plasma.

3. The method for manufacturing the laminated ceramic chip component provided with the nano thin film layer of claim 1, wherein the nano thin film layer is formed on a whole outer surface of the external electrode part.

4. The method for manufacturing the laminated ceramic chip component provided with the nano thin film layer of claim 1, wherein the nano thin film layer is also formed on an outer surface of the ceramic main body exposed between the first external electrode and the second external electrode.

* * * * *